(12) United States Patent
Tekumalla

(10) Patent No.: US 8,615,693 B2
(45) Date of Patent: Dec. 24, 2013

(54) SCAN TEST CIRCUITRY COMPRISING SCAN CELLS WITH MULTIPLE SCAN INPUTS

(75) Inventor: Ramesh C. Tekumalla, Breinigsville, PA (US)

(73) Assignee: LSI Corporation, San Jose, CA (US)

( * ) Notice: Subject to any disclaimer, the term of this patent is extended or adjusted under 35 U.S.C. 154(b) by 181 days.

(21) Appl. No.: 13/222,663

(22) Filed: Aug. 31, 2011

(65) Prior Publication Data

US 2013/0055041 A1 Feb. 28, 2013

(51) Int. Cl.
 *G01R 31/28* (2006.01)

(52) U.S. Cl.
 USPC .............................. 714/726; 714/724; 714/758

(58) Field of Classification Search
 USPC .................. 714/726, 727, 724, 758, 700
 See application file for complete search history.

(56) References Cited

U.S. PATENT DOCUMENTS

| | | | |
|---|---|---|---|
| 4,698,588 A | 10/1987 | Hwang et al. | |
| 4,931,722 A | 6/1990 | Stoica | |
| 5,130,988 A * | 7/1992 | Wilcox et al. | 714/727 |
| 5,887,004 A | 3/1999 | Walther | |
| 6,114,892 A | 9/2000 | Jin | |
| 6,412,098 B1 | 6/2002 | Jin | |
| 6,640,324 B1 | 10/2003 | Goldovsky | |
| 6,886,145 B2 | 4/2005 | Davidson et al. | |
| 7,278,074 B2 * | 10/2007 | Mitra et al. | 714/724 |
| 7,831,876 B2 | 11/2010 | Goyal et al. | |
| 7,900,105 B2 | 3/2011 | Kapur et al. | |
| 2003/0037296 A1 | 2/2003 | Yoshimoto | |
| 2003/0070128 A1 | 4/2003 | Akasaka et al. | |
| 2004/0119502 A1 | 6/2004 | Chandar et al. | |
| 2007/0234169 A1 | 10/2007 | Rajski et al. | |
| 2008/0115025 A1 | 5/2008 | Frederick | |
| 2009/0235132 A1 | 9/2009 | Wang et al. | |
| 2010/0218060 A1 | 8/2010 | Nakako | |

FOREIGN PATENT DOCUMENTS

| | | | |
|---|---|---|---|
| JP | 4165644 | A | 6/1992 |
| JP | 5172897 | A | 7/1993 |
| TW | 594030 | B | 6/2004 |
| WO | 0140943 | A2 | 6/2001 |
| WO | 0148493 | A2 | 7/2001 |

OTHER PUBLICATIONS

C-W. Tzeng et al., "Split-Masking: An Output Masking Scheme for Effective Compound Defect Diagnosis in Scan Architecture with Test Compression," IEEE Transactions on Computer-Aided Design of Integrated Circuits and Systems, May 2010, pp. 834-839, vol. 29.

(Continued)

*Primary Examiner* — Fritz Alphonse
(74) *Attorney, Agent, or Firm* — Ryan, Mason & Lewis, LLP

(57) ABSTRACT

An integrated circuit comprises scan test circuitry and additional circuitry subject to testing utilizing the scan test circuitry. The scan test circuitry comprises scan cells configured to form scan chains. At least a given one of the scan cells is a multiple scan input scan cell having at least first and second scan inputs. In a first scan shift mode of operation, the given scan cell is configured with a first plurality of other scan cells into a scan chain of a first type using the first scan input. In a second scan shift mode of operation, the given scan cell is configured with a second plurality of other scan cells different than the first plurality of other scan cells into a scan chain of a second type using the second scan input.

20 Claims, 4 Drawing Sheets

(56) References Cited

OTHER PUBLICATIONS

X. Tang et al., "Improving Compressed Test Pattern Generation for Multiple Scan Chain Failure Diagnosis," Proceedings of the Design, Automation & Test in Europe Conference & Exhibition, 2009, Apr. 2009, pp. 1000-1005, Nice, France.

Y. Huang et al., "Diagnosis with Limited Failure Information," Proceedings of the International Test Conference, 2006, Oct. 2006, pp. 1-10.

Y. Tsiatouhas, "A Scan Flip-Flop for Low-Power Scan Operation," 14th IEEE International Conference, Electronics, Circuits and Systems (ICECS), Dec. 2007, pp. 439-432.

N. Parimi et al., "Toggle-Masking for Test-per-Scan VLSI Circuits," Proceedings of the 19th IEEE International Symposium on Defect and Fault Tolerance in VLSI Systems, Oct. 2004, pp. 332-338, Cannes, France.

N. Parimi et al., "Design of a Low-Power D Flip-Flop for Test-Per-Scan Circuits," Canadian Conference on Electrical and Computer Engineering, May 2004, pp. 777-780, vol. 2.

Z. Chen et al., "Low-Capture-Power At-Speed Testing using Partial Launch-on-Capture Test Scheme," IEEE Proceedings VLSI Test Symposium, Apr. 2010, pp. 141-146.

A. Mishra et al., "Modified Scan Flip-Flop for Low Power Testing," 19th IEEE Asian Test Symposium (ATS), Dec. 2010, pp. 367-370, Shanghai, China.

Chris Allsup, "The Economics of Implementing Scan Compression to Reduce Test Data Volume and Test Application Time," IEEE International Test Conference (ITC), Oct. 2006, pp. 1-9.

D. Hsu et al., "Scan Compression Implementation in Industrial Design—Case Study," Proceedings of the Asian Test Symposium, 2009, 2 pages.

R. Kapur et al., Historical Perspective on Scan Compression, IEEE Design & Test of Computers, Mar.-Apr. 2008, pp. 114-120, vol. 25, No. 2.

P. Wohl et al., "Minimizing the Impact of Scan Compression," IEEE VLSI Test Symposium (VTS), May 2007, pp. 67-74.

U.S. Appl. No. 13/164,345, filed in the name of R. Tekumalla et al. on Jun. 20, 2011 and entitled "Integrated Circuit Comprising Scan Test Circuitry with Parallel Reordered Scan Chains."

* cited by examiner

SCAN TEST CIRCUITRY COMPRISING SCAN CELLS WITH MULTIPLE SCAN INPUTS

FIELD OF THE INVENTION

The present invention relates generally to integrated circuit testing, and more particularly to integrated circuit testing using scan test circuitry.

BACKGROUND OF THE INVENTION

Integrated circuits are often designed to incorporate scan test circuitry that facilitates testing for various internal fault conditions. Such scan test circuitry typically comprises scan chains, which are chains of flip-flops that are used to form serial shift registers for applying test patterns at inputs to combinational logic of the integrated circuit and for reading out the corresponding results. A given one of the flip-flops of the scan chain may be viewed as an example of what is more generally referred to herein as a "scan cell."

In one exemplary arrangement, an integrated circuit with scan test circuitry may have a scan shift mode of operation and a functional mode of operation. A flag may be used to indicate whether the integrated circuit is in scan shift mode or functional mode. In the scan shift mode, the flip-flops of the scan chain are configured as a serial shift register. A test pattern is then shifted into the serial shift register formed by the flip-flops of the scan chain. Once the desired test pattern has been shifted in, the scan shift mode is disabled and the integrated circuit is placed in its functional mode. Internal combinational logic results occurring during this functional mode of operation are then captured by the chain of scan flip-flops. The integrated circuit is then once again placed in its scan shift mode of operation, in order to allow the captured combinational logic results to be shifted out of the serial shift register formed by the scan flip-flops, as a new test pattern is being scanned in. This process is repeated until all desired test patterns have been applied to the integrated circuit.

As integrated circuits have become increasingly complex, scan compression techniques have been developed which reduce the number of test patterns that need to be applied when testing a given integrated circuit, and therefore also reduce the required test time. However, the use of high levels of scan compression can adversely impact diagnostic resolution, that is, the ability to attribute a particular failure to an exact fault or set of faults within the combinational logic. As a result, when using scan compression, a tradeoff exists between compression level and diagnostic resolution. Additional details regarding compressed scan testing are disclosed in U.S. Pat. No. 7,831,876, entitled "Testing a Circuit with Compressed Scan Subsets," which is commonly assigned herewith and incorporated by reference herein.

SUMMARY OF THE INVENTION

Illustrative embodiments of the invention provide a substantial improvement in diagnostic resolution through the use of scan test circuitry which implements vertical scan chains in a first scan shift mode of operation and horizontal scan chains in a second scan shift mode of operation. For example, scan test circuitry configured in this manner allows the identification of one or more particular flip-flops or other circuit elements that caused a given applied test pattern to indicate a failure, independently of the fault models that were used to generate that test pattern.

In one aspect, an integrated circuit comprises scan test circuitry and additional circuitry subject to testing utilizing the scan test circuitry. The scan test circuitry comprises scan cells configured to form scan chains. At least a given one of the scan cells is a multiple scan input scan cell having at least first and second scan inputs. In a first scan shift mode of operation, the given scan cell is configured with a first plurality of other scan cells into a scan chain of a first type using the first scan input. In a second scan shift mode of operation, the given scan cell is configured with a second plurality of other scan cells different than the first plurality of other scan cells into a scan chain of a second type using the second scan input. The scan chain of the first type may comprise a vertical scan chain and the scan chain of the second type may comprise a horizontal scan chain.

In another aspect, a multiple scan input scan cell comprises at least first and second scan inputs. In a first scan shift mode of operation, the scan cell is configured with a first plurality of other scan cells into a scan chain of a first type using the first scan input, and in a second scan shift mode of operation, the scan cell is configured with a second plurality of other scan cells different than the first plurality of other scan cells into a scan chain of a second type using the second scan input.

A given scan cell in one or more of the illustrative embodiments may comprise, in addition to its first and second scan inputs, a data input, a scan enable input, and a diagnostic enable input. A particular one of the first and second scan shift modes may be selected responsive to logic states of both a scan enable signal applied to the scan enable input and a diagnostic enable signal applied to the diagnostic enable input.

The scan test circuitry in one or more of the illustrative embodiments may further comprise a decompressor and a compressor. The scan chain of the first type in such an arrangement may be one of a plurality of vertical scan chains arranged in parallel with one another between respective outputs of the decompressor and respective inputs of the compressor. Scan test input data from the decompressor is shifted into the vertical scan chains and scan test output data is shifted out of the vertical scan chains into the compressor. The scan chain of the second type may be one of a plurality of horizontal scan chains with each such horizontal scan chain being formed by a plurality of scan cells including one scan cell from each of a corresponding subset of the plurality of vertical scan chains. The plurality of horizontal scan chains may include one horizontal scan chain for each of the outputs of the compressor. The scan test circuitry may further comprise multiplexing circuitry configured to select between outputs of the compressor and corresponding outputs of respective ones of the plurality of horizontal scan chains responsive to a diagnostic enable signal.

Advantageously, improved diagnostic resolution is provided in one or more of the illustrative embodiments without any significant negative impact on integrated circuit area requirements or functional timing requirements. A diagnostic process utilizing the horizontal scan chains in the second scan shift mode of operation allows for simple debugging of scan compression failures.

DETAILED DESCRIPTION OF THE INVENTION

The invention will be illustrated herein in conjunction with exemplary testing systems and corresponding integrated circuits comprising scan test circuitry for supporting scan testing of other internal circuitry of those integrated circuits. It should be understood, however, that the invention is more generally applicable to any testing system or associated integrated circuit in which it is desirable to improve the diagnostic resolution associated with scan compression testing.

Figure 1:
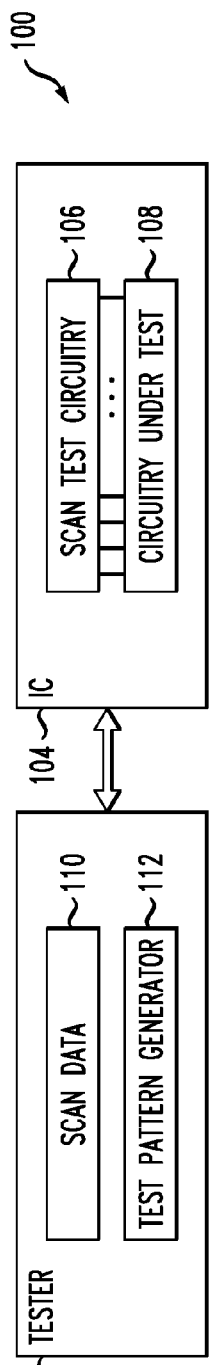
FIG. 1 is a block diagram showing an integrated circuit testing system comprising a tester and an integrated circuit under test in an illustrative embodiment.

FIG. 1 shows a testing system 100 comprising a tester 102 and an integrated circuit under test 104. The integrated circuit 104 comprises scan test circuitry 106 that is coupled to additional internal circuitry 108 that is subject to testing utilizing the scan test circuitry 106. The tester 102 stores scan data 110 associated with scan testing of the integrated circuit. Such scan data may correspond to test patterns provided by a test pattern generator 112. In other embodiments, at least a portion of the tester 102, such as the test pattern generator 112, may be incorporated into the integrated circuit 104. Alternatively, the entire tester 102 may be incorporated into the integrated circuit 104.

The particular configuration of testing system 100 as shown in FIG. 1 is exemplary only, and the testing system 100 in other embodiments may include other elements in addition to or in place of those specifically shown, including one or more elements of a type commonly found in a conventional implementation of such a system. For example, various elements of the tester 102 or other parts of the system 100 may be implemented, by way of illustration only and without limitation, utilizing a microprocessor, central processing unit (CPU), digital signal processor (DSP), application-specific integrated circuit (ASIC), field-programmable gate array (FPGA), or other type of data processing device, as well as portions or combinations of these and other devices.

Embodiments of the present invention may be configured to utilize compressed or noncompressed scan testing, and the invention is not limited in this regard. However, the illustrative embodiments such as those shown in FIGS. 2 and 3 will be described primarily in the context of compressed scan testing.

Figure 2:
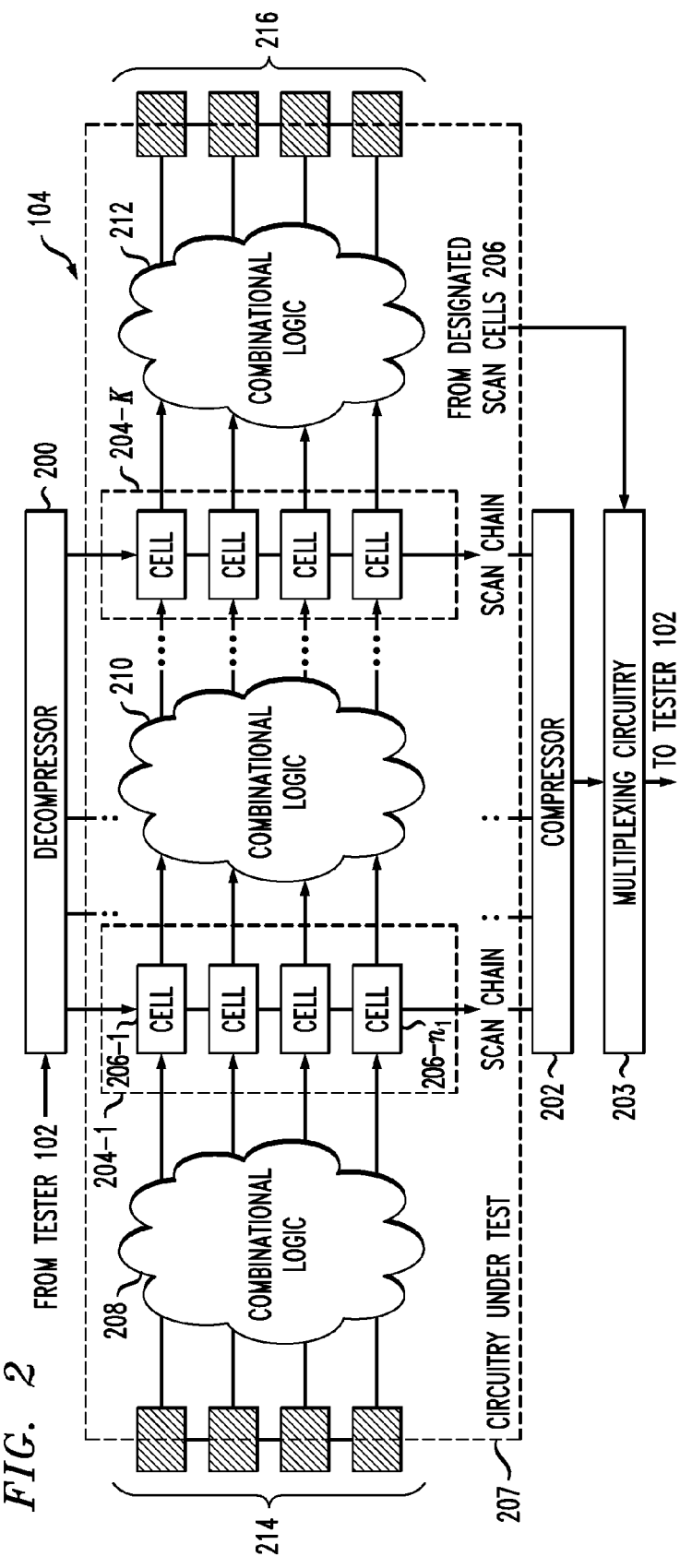
FIG. 2 illustrates one example of the manner in which scan chains may be arranged between combinational logic in the integrated circuit of FIG. 1.

Referring now to FIG. 2, portions of one potential configuration of the integrated circuit 104 are shown in greater detail. In this compressed scan testing arrangement, the scan test circuitry 106 comprises a decompressor 200, a compressor 202, multiplexing circuitry 203, and a plurality of scan chains 204-$k$, where k=1, 2, . . . K. Each of the scan chains 204 comprises a plurality of scan cells 206, and is configurable to operate as a serial shift register in a first scan shift mode of operation of the integrated circuit 104 and to capture functional data from circuitry under test 207 in a functional mode of operation of the integrated circuit 104. The scan chains 204 may be viewed as examples of what are more generally referred to herein as "vertical scan chains," and are arranged in parallel with one another between respective outputs of the decompressor 200 and respective inputs of the compressor 202, such that in the first scan shift mode of operation, scan test input data from the decompressor 200 is shifted into the vertical scan chains 204 and scan test output data is shifted out of the vertical scan chains 204 into the compressor 202.

The scan test circuitry 106 further supports a second scan shift mode of operation, as will be described in greater detail below in conjunction with FIG. 3. In this second scan shift mode of operation, also referred to herein as a diagnostic mode, designated scan cells 206 of the scan test circuitry 106 are configured to form multiple horizontal scan chains. Each such horizontal scan chain is formed by a plurality of scan cells including one scan cell from each of a corresponding subset of the plurality of vertical scan chains In the present embodiment, there is one horizontal scan chain for each of N scan test outputs of the compressor 202. The multiplexing circuitry 203 is configured to select between outputs of the compressor 202 and corresponding outputs of respective ones of the plurality of horizontal scan chains. More particularly, in the first scan shift mode of operation, the multiplexing circuitry 203 selects the outputs of the compressor 202 for delivery to the tester 102 and in the second scan shift mode of operation the multiplexing circuitry 203 selects the outputs of the horizontal scan chains for delivery to the tester 102. The decompressor 200 and compressor 202 may be combinational or sequential, and the functionality disclosed herein does not require any particular combinational or sequential compression arrangement.

The first vertical scan chain 204-1 is of length $n_1$ and therefore comprises $n_1$ scan cells denoted 206-1 through 206-$n_1$. More generally, vertical scan chain 204-$k$ is of length $n_k$ and therefore comprises a total of $n_k$ scan cells. Circuitry under test 207 in this embodiment comprises a plurality of combinational logic blocks, of which exemplary blocks 208, 210 and 212 are shown. The combinational logic blocks are illustratively arranged between primary inputs 214 and primary outputs 216 and separated from one another by the vertical scan chains 204.

Combinational logic blocks such as 208, 210 and 212 may be viewed as examples of what are more generally referred to herein as "additional circuitry" that is subject to testing utilizing scan test circuitry in embodiments of the present invention. By way of example, such blocks may represent portions of different integrated circuit cores, such as respective read channel and additional cores of a system-on-chip (SOC) integrated circuit in a hard disk drive (HDD) controller application. In other embodiments, the circuit blocks subject to testing by the scan chains may comprise other types of functional logic circuitry, in any combination, and the term "additional circuitry" in intended to be broadly construed so as to cover any such arrangements of logic circuitry.

The number K of vertical scan chains 204 is generally much larger than the number N of scan test outputs of the compressor 202. The ratio of K to N provides a measure of the degree of scan test pattern compression provided in the scan test circuitry 106. It should be noted, however, that the number of compressor outputs need not be the same as the number of decompressor inputs. For example, there may be N decompressor inputs and L compressor outputs, where N≠L but both N and L are much smaller than K.

The decompressor 200 receives compressed scan data from the tester 102 and decompresses that scan data to generate scan test input data that is shifted into the vertical scan chains 204 when such chains are configured as respective serial shift registers in the first scan shift mode of operation. The compressor 202 receives scan test output data shifted out of the vertical scan chains 204, also when such chains are configured as respective serial shift registers in the first scan shift mode of operation, and compresses that scan test output data for delivery back to the tester 102. Additional details regarding the operation of scan compression elements such as decompressor 200 and compressor 202 may be found in the above-cited U.S. Pat. No. 7,831,876. Again, scan compression elements such as decompressor 200 and compressor 202 may be eliminated in other embodiments.

As indicated previously, scan compression reduces the number of test patterns that need to be applied when testing an integrated circuit, but can adversely impact diagnostic resolution. For example, it can be very difficult to identify a particular failed flip-flop or other failed element of the combinational logic blocks 208, 210 or 212 by conventional processing of the outputs of the compressor 202. The present embodiment provides significantly improved diagnostic resolution in the scan test circuitry 106 through the provision of the horizontal scan chains, multiplexing circuitry and associated second scan shift mode of operation mentioned above.

Figure 3:
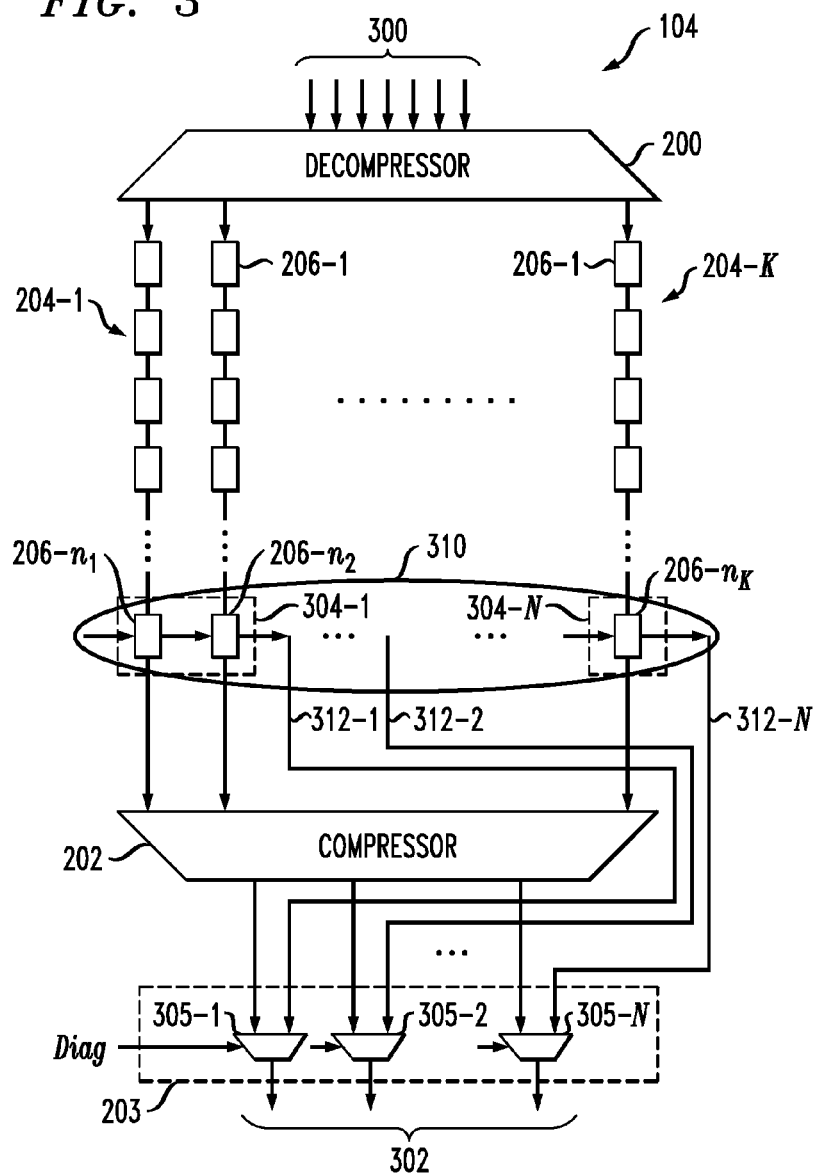
FIG. 3 is a more detailed view of portions of the scan test circuitry of FIG. 2.

FIG. 3 shows the scan test circuitry 106 in greater detail. The scan cells 206 are utilized to form K vertical scan chains 204 as previously described. In the first scan shift mode of operation, compressed scan input data is applied by tester 102 to N scan inputs 300 of decompressor 200 and compressor 202 provides compressed scan output data back to tester 102 via N scan outputs 302. The vertical scan chains 204 are arranged in parallel between respective outputs of the decompressor 200 and respective inputs of the compressor 202 as shown. Each of the individual vertical scan chains 204 is configurable to operate as a serial shift register in the first scan shift mode of operation of the integrated circuit 104 and also to capture functional data from combinational logic elements in a functional mode of operation of the integrated circuit 104.

In a typical implementation, the lengths of the scan chains 204 are balanced so that the same amount of time is needed to shift the desired set of scan test patterns into all of the scan chains. It may therefore be assumed without limitation that all of the scan chains 204 are of length n, such that $n_1=n_2=\ldots=n_k=n$.

Designated ones of the scan cells 206 are used not only as part of the vertical scan chains 204 in the first scan shift mode of operation, but are also used to form N horizontal scan chains 304-1 through 304-N in the second scan shift mode of operation. More specifically, each of the horizontal scan chains 304 in the present embodiment is formed using one designated scan cell from each of a corresponding subset of the vertical scan chains 204. As indicated above, there are N horizontal scan chains 304, and therefore one horizontal scan chain for each of the N outputs of the compressor 202.

In the present embodiment, the one designated scan cell 206 from each vertical scan chain 204-$i$, $i=1, 2, \ldots K$, that is used in forming the horizontal scan chains 304 is the final scan cell of that chain, and these final scan cells of the respective vertical chains are collectively denoted by reference numeral 310 in the figure. Thus, the first horizontal scan chain 304-1 is formed by final scan cells 206-$n_1$ and 206-$n_2$ as shown. Similarly, the final horizontal scan chain 304-N includes final scan cell 206-$n_k$ and may include final scan cells from one or more other ones of the vertical scan chains 204.

The horizontal scan chain 304-$j$, $j=1, 2, \ldots N$, has an output 312-$j$ that bypasses the compressor 202 and is applied to one input of a corresponding two-to-one multiplexer 305-$j$ of the multiplexing circuitry 203. The multiplexing circuitry 203 utilizes the multiplexers 305 to select between the N outputs of the compressor 202 and the corresponding outputs of respective ones of the N horizontal scan chains. More specifically, in the first scan shift mode of operation, the multiplexing circuitry 203 selects the N outputs of the compressor 202 for delivery to the tester 102 and in the second scan shift mode of operation the multiplexing circuitry 203 selects the outputs 312 of the horizontal scan chains 304 for delivery to the tester 102. This selection is performed responsive to a diagnostic enable signal Diag which is applied to the select line of each of the multiplexers 305. Each of the multiplexers 305 thus has a first input coupled to a corresponding one of the N outputs of the compressor 202, a second input coupled to a corresponding one of the N outputs of the horizontal scan chains 304, and a select line driven by the diagnostic enable signal Diag.

In other embodiments, the outputs 312 of the horizontal scan chains 304 may be sent directly to one or more separate pins of the integrated circuit 104, other than those driven by the compressor outputs. In a given arrangement of this type, the multiplexing circuitry 203 may be eliminated entirely or possibly implemented off-chip with appropriate corresponding changes to board-level design.

The horizontal scan chains 304 are implemented in the present embodiment by utilizing a particular type of scan cell for the final scan cell 206-$n_i$, $i=1, 2, \ldots K$, in each of the vertical scan chains 204. This particular type of scan cell includes at least first and second scan inputs, and is therefore also referred to herein as a "dual scan input scan cell." In the first scan shift mode of operation, a given one of the final scan cells 206-$n_i$ is configured to be part of the corresponding vertical scan chain 204-$i$, and in the second scan shift mode of operation, the given final scan cell 206-$n_i$ is configured to be part of the corresponding horizontal scan chain 304-$j$, $j=1, 2, \ldots N$. Thus, each of the final scan cells is part of a vertical scan chain in the first scan shift mode of operation and part of a horizontal scan chain in the second scan shift mode of operation.

Although only the final scan cells 310 of the vertical scan chains 204 are used to form horizontal scan chains 304 in the present embodiment, this is by way of illustrative example. In other embodiments, non-final scan cells of the vertical scan chains may be used to form horizontal scan chains, or alternatively multiple non-final and final scan cells may be used, in any desired combination. However, implementing only the final scan cells of the vertical scan chains as dual scan input scan cells helps to minimize the area impact of this functionality.

It should be noted that the horizontal shift path through the final scan cells 310 should be timed to allow appropriate switching of the Diag signal during a tester cycle. Since the shift frequency is usually fairly slow, this should not be an issue, but in other embodiments it may be addressed by including one or more pipeline stages on the horizontal shift path.

Figure 4:
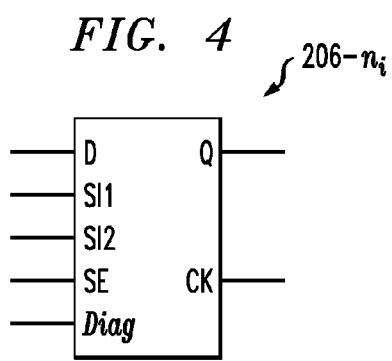
FIG. 4 illustrates a given one of the scan cells of the scan test circuitry of FIGS. 2 and 3.

FIG. 4 shows a given one of the dual scan input scan cells 206-$n_i$ in more detail. In this example, the dual scan input scan cell has a functional data input (D), a first scan input (SI1), a second scan input (SI2), a scan enable input (SE) adapted to receive a corresponding scan enable signal, a data output (Q), a diagnostic enable input (Diag) adapted to receive the corresponding diagnostic enable signal, and a clock input (CK). It should be noted that in certain cases, such as SE and Diag, the same designators will be used to refer to both the scan cell terminals and the corresponding signals applied to those terminals.

The single data output Q of the scan cell is utilized to provide functional data output in a functional mode of operation and scan output in the first and second scan shift modes of operation. Alternatively, the scan cell may be configured to have separate functional data and scan outputs, as will be appreciated by those skilled in the art.

A particular one of the first and second scan shift modes is selected responsive to logic states of both the scan enable signal SE applied to the scan enable input and the diagnostic enable signal Diag applied to the diagnostic enable input.

Although only a single final dual scan input scan cell 206-$n_i$ is shown in FIG. 4, it may be assumed that the other final scan cells 206 of the scan chains 204 in the scan test circuitry of FIGS. 2 and 3 are each configured in substantially the same manner Alternatively, different types of scan cells may be used in different ones of the scan chains, or within the same scan chain.

Figure 5A:
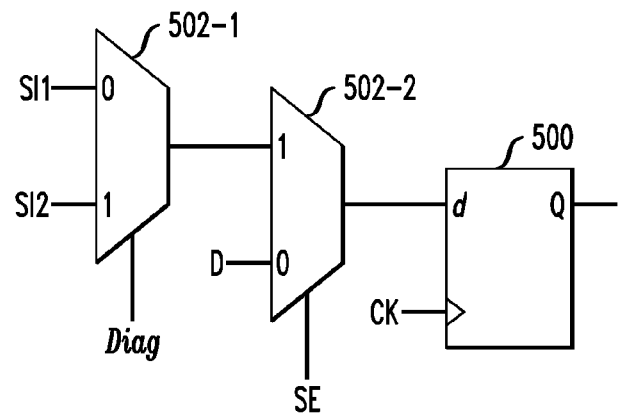
FIGS. 5A, 5B and 5C are respective schematic diagrams of exemplary circuit implementations of the scan cell of FIG. 4.
Figure 5B:
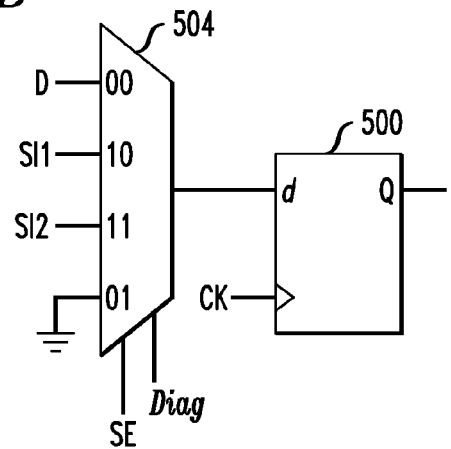
Figure 5C:
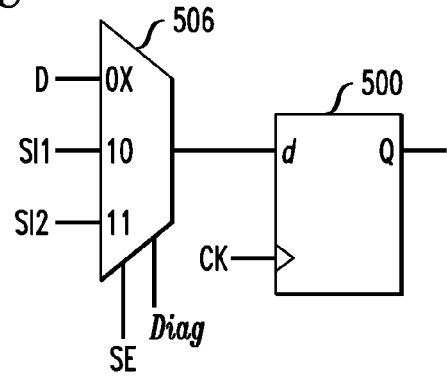

Exemplary circuit implementations of the dual scan input scan cell 206-$n_i$ of FIG. 4 are shown in FIGS. 5A, 5B and 5C.

It will be assumed in these embodiments that the scan enable signal applied to the scan enable input SE of the scan cell is driven to a logic "1" level to place the integrated circuit 104 in one of the first or second scan shift modes of operation, and driven to a logic "0" level to place the integrated circuit 104 in the functional mode of operation. Also, when the scan enable input SE is at its logic "1" level, the diagnostic enable signal applied to the diagnostic enable input Diag of the scan cell is driven to a logic "0" level to place the integrated circuit 104 in the first scan shift mode, which utilizes the first scan shift inputs SI1 of the final scan cells in forming the vertical scan chains 204, and is driven to a logic "1" level to place the integrated circuit 104 in the second scan shift mode, which utilizes the second scan shift inputs SI2 of the final scan cells in forming the horizontal scan chains 304. As indicated previously, the second scan shift mode is also referred to herein as the diagnostic mode. Other types and combinations of operating modes and scan or diagnostic enable signaling may be used in other embodiments.

Referring initially to FIG. 5A, the dual scan input scan cell comprises a flip-flop 500 and first and second multiplexers 502-1 and 502-2. The flip-flop 500 has a data input denoted d and its data output corresponds to the data output Q of the scan cell. The flip-flop 500 is illustratively a non-resettable D-type flip-flop in the present embodiment, although other types of flip-flops can be used in other embodiments. The first multiplexer 502-1 has first and second inputs coupled to the respective first and second scan inputs SI1 and SI2 of the scan cell. The second multiplexer 502-2 has a first input coupled to an output of the first multiplexer 502-1 and a second input coupled to the data input D of the scan cell. The data input d of the flip-flop 500 is coupled to an output of the second multiplexer 502-2. The select lines of the first and second multiplexers 502-1 and 502-2 are coupled to the diagnostic enable input Diag and the scan enable input SE, respectively.

In operation, when Diag is at a logic "0" level, the first multiplexer 502-1 selects the first scan input SI1 for propagation to its output, which is coupled to an input of the second multiplexer 502-2. Assuming that SE is at a logic "1" level, the second multiplexer selects SI1 for application to the data input d of the flip-flop 500. This set of signaling conditions corresponds to the first scan shift mode of operation.

If Diag is instead at a logic "1" level, the first multiplexer 502-1 selects the second scan input SI2 for propagation to its output. Again assuming that SE is at a logic "1" level, the second multiplexer 502-2 selects SI2 for application to the data input d of the flip-flop 500. This set of signaling conditions corresponds to the second scan shift mode of operation.

Finally, if SE is at a logic "0" level, the second multiplexer 502-2 selects the data input D for application to the data input d of the flip-flop 500, regardless of the logic level of Diag. This set of signaling conditions corresponds to the functional mode of operation.

FIG. 5B shows an alternative arrangement in which the two two-to-one multiplexers 502 of FIG. 5A are replaced with a single four-to-one multiplexer 504 having first and second select lines. The multiplexer 504 has a first input coupled to the data input D of the scan cell, second and third inputs coupled to the respective first and second scan inputs SI1 and SI2 of the scan cell, and a fourth input coupled to ground potential. The output of the multiplexer 504 is coupled to the data input d of the flip-flop 500. The first and second select lines of the multiplexer 504 are coupled to the scan enable input SE and the diagnostic enable input Diag, respectively.

In operation, when Diag is at a logic "0" level, the multiplexer 504 selects either the data input D or the first scan input SI1 for propagation to its output, which is coupled to the data input d of the flip-flop 500. Assuming that SE is at a logic "1" level, the multiplexer selects SI1 for application to the data input d of the flip-flop 500. This set of signaling conditions corresponds to the first scan shift mode of operation.

If Diag is instead at a logic "1" level, and again assuming that SE is at a logic "1" level, the multiplexer 504 selects the second scan input SI2 for propagation to its output and thus to the data input d of the flip-flop 500. This set of signaling conditions corresponds to the second scan shift mode of operation.

Finally, if SE is at a logic "0" level, the multiplexer 504 selects the data input D for application to the data input d of the flip-flop 500, regardless of the logic level of Diag. This set of signaling conditions corresponds to the functional mode of operation.

Another possible alternative arrangement is shown in FIG. 5C, and includes a three-to-one multiplexer 506 configured in a manner similar to multiplexer 504, but without the additional input coupled to ground potential. The operation of the FIG. 5C embodiment is substantially the same as that of the FIG. 5B embodiment. When SE is at a logic "0" level, Diag is indicated as a don't care value (X).

It is to be appreciated that the particular circuits shown in FIGS. 5A, 5B and 5C are presented by way of illustrative example only, and numerous alternative arrangements of circuitry may be used to implement dual scan input scan cells to support first and second scan shift modes of operation as disclosed herein.

In alternative embodiments, at least a subset of the scan cells can be configured to support more than two scan paths. Thus, a multiple scan input scan cell in an alternative embodiment may comprise more than two scan inputs, and associated logic circuitry for permitting selection among the various scan paths.

The scan test circuitry 106 as described above, which utilizes vertical scan chains 204 in a first scan shift mode of operation and horizontal scan chains 304 in a second scan shift mode of operation, provides a substantial improvement in diagnostic resolution. For example, scan test circuitry configured in this manner allows the identification of one or more particular flip-flops or other circuit elements that caused a given applied test pattern to indicate a failure, independently of the fault models that were used to generate that test pattern.

The manner in which diagnostic resolution may be improved in an illustrative embodiment will now be described in greater detail. During scan testing, the tester 102 applies compressed test patterns to the decompressor 200 and observes the outputs of the compressor 202 as selected by the multiplexing circuitry 203. The actual responses from the compressor are compared against the expected responses. When the test patterns are being applied, Diag is set to a logic "0" level and the set of final scan cells 310 are either shifting in the vertical direction in the first scan shift mode of operation or capturing functional data from circuitry under test 207 in the functional mode of operation, depending on the logic level of the shift enable signal SE.

Let C denote a tester cycle where one or more discrepancies are observed at the outputs of the compressor 202. Let n be the length of each of the vertical scan chains 204. The following formula summarizes the relationship between C and n:

$$C=T+n*X+Y,$$

where T is the overhead test setup time before the actual test pattern application starts, X is the number of test patterns applied so far during the test and Y<n is the index of scan cells that are being shifted out on tester cycle C, where the index Y starts from 0 corresponding to the dual scan input scan cells 310 and increments up the vertical scan chains 204 towards the decompressor 200. For example, if Y=4, this represents the fourth scan cells above the respective dual scan input scan cells 310 in the vertical scan chains 204.

When at least one discrepancy is observed on tester cycle C, the above-described diagnostic mode or second scan shift mode is entered, by driving Diag to a logic "1" level while SE remains at a logic "1" level. The dual scan input scan cells 310 therefore change from their first or vertical scan shift mode to their second or horizontal scan shift mode. It should also be noticed that this change in the Diag logic level will cause the multiplexers 305 of multiplexing circuitry 203 to select the outputs of the horizontal scan chains 304 instead of the outputs of the compressor 202 for delivery to the tester 102.

In the diagnostic mode, the outputs of the horizontal scan chains can be processed to determine the particular flip-flop or flip-flops that caused the observed discrepancy, thereby providing a higher diagnostic resolution than could be obtained by observing only the outputs of the compressor 202. For example, the expected response of the dual scan input scan cells 310 can be obtained and utilized in combination with the knowledge of which scan cells are being shifted out on tester cycle C to identify a failing flip-flop. This diagnostic process can be repeated for every tester cycle for which at least one discrepancy is observed by the tester 102.

The illustrative embodiments provide improved diagnostic resolution in compressed scan testing by providing a first scan shift mode which utilizes vertical scan chains and a second scan shift mode which utilizes horizontal scan chains in conjunction with multiplexing circuitry that allows compressor outputs to be bypassed. These dual scan shift modes are supported using dual scan input scan cells 310 as the final scan cells in each of the vertical scan chains 204. Area impact of the improved scan circuitry is minimal because the dual scan input scan cells may be used only for the final scan cells of the vertical scan chains 204, as illustrated in FIG. 3, although numerous other arrangements are possible. The diagnostic process described above allows for simple debugging of scan compression failures. The additional logic required to support the diagnostic mode does not adversely impact the functional timing requirements of the integrated circuit design.

A dual scan input scan cell of the type shown in FIG. 4 may be generated by modifying a standard scan cell from an integrated circuit design library to incorporate the additional circuitry in the form of a wrapper around the standard cell. This can be achieved without requiring the modification of any internal signaling or timing features of the standard cell, and without adding ports, extra flip-flops or other internal circuitry to the standard cell.

Figure 6:
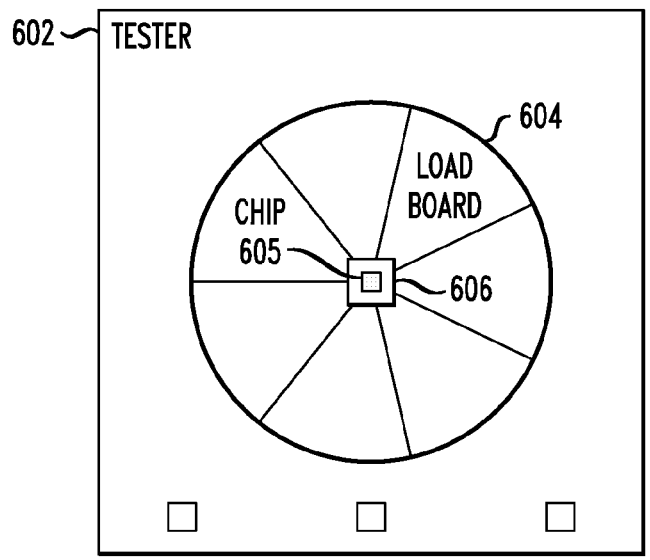
FIG. 6 shows one possible implementation of the testing system of FIG. 1.

The tester 102 in the testing system 100 of FIG. 1 need not take any particular form, and various conventional testing system arrangements can be modified in a straightforward manner to support the multiple scan shift modes. One possible example is shown in FIG. 6, in which a tester 602 comprises a load board 604 in which an integrated circuit 605 to be subject to scan testing using the techniques disclosed herein is installed in a central portion 606 of the load board 604. The tester 602 may also comprise processor and memory elements for executing stored computer code, although such elements are not explicitly shown in the figure. Numerous alternative testers may be used to perform scan testing of an integrated circuit as disclosed herein.

Figure 7:
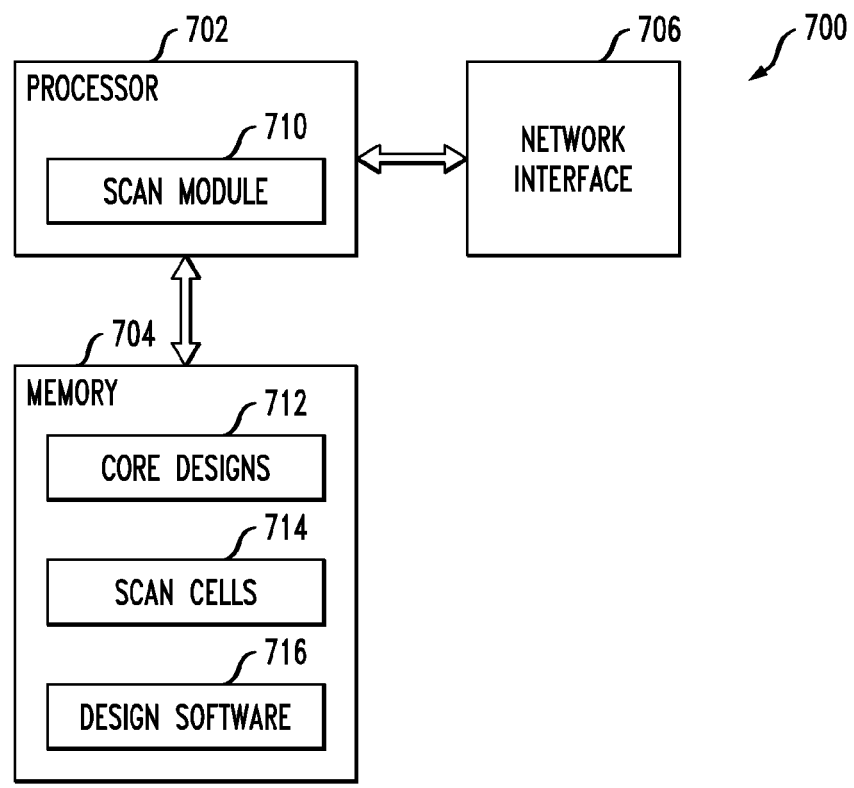
FIG. 7 is a block diagram of a processing system for generating an integrated circuit design comprising one or more scan chains each having one or more scan cells of the type shown in FIGS. 4 and 5.

The insertion of scan cells to form scan chains in scan test circuitry of an integrated circuit design may be performed in a processing system 700 of the type shown in FIG. 7. Such a processing system is configured for use in designing integrated circuits such as integrated circuit 104 to include scan test circuitry 106. The processing system 700 comprises a processor 702 coupled to a memory 704. Also coupled to the processor 702 is a network interface 706 for permitting the processing system to communicate with other systems and devices over one or more networks. The network interface 706 may therefore comprise one or more transceivers. The processor 702 implements a scan module 710 for supplementing core designs 712 with scan cells 714 in the manner disclosed herein, in conjunction with utilization of integrated circuit design software 716.

Elements such as 710, 712, 714 and 716 are implemented at least in part in the form of software stored in memory 704 and processed by processor 702. For example, the memory 704 may store program code that is executed by the processor 702 to implement particular scan cell insertion functionality of module 710 within an overall integrated circuit design process. The memory 704 is an example of what is more generally referred to herein as a computer-readable medium or other type of computer program product having computer program code embodied therein, and may comprise, for example, electronic memory such as RAM or ROM, magnetic memory, optical memory, or other types of storage devices in any combination. The processor 702 may comprise a microprocessor, CPU, ASIC, FPGA or other type of processing device, as well as portions or combinations of such devices.

As indicated above, embodiments of the present invention may be implemented in the form of integrated circuits. In a given such integrated circuit implementation, identical die are typically formed in a repeated pattern on a surface of a semiconductor wafer. Each die includes scan test circuitry as described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Again, it should be emphasized that the embodiments of the invention as described herein are intended to be illustrative only. For example, the invention can be implemented using a wide variety of other types of scan test circuitry, with different types and arrangements of multiple scan input scan cells, logic gates and other circuit elements, than those previously described in conjunction with the illustrative embodiments. These and numerous other alternative embodiments within the scope of the following claims will be readily apparent to those skilled in the art.

What is claimed is:

1. An integrated circuit comprising:
   scan test circuitry; and additional circuitry subject to testing utilizing the scan test circuitry;

the scan test circuitry comprising scan cells configured to form scan chains;

at least a given one of the scan cells having at least first and second scan inputs;

wherein in a first scan shift mode of operation the given scan cell is configured with a first set of one or more other scan cells into a scan chain of a first type using the first scan input; and wherein in a second scan shift mode of operation the given scan cell is configured with a second set of one or more other scan cells different than the first set of one or more other scan cells into a scan chain of a second type using the second scan input.

2. The integrated circuit of claim 1 wherein the given scan cell further comprises:

a data input;

a data output;

a scan enable input; and a diagnostic enable input;

wherein a particular one of the first and second scan shift modes is selected responsive to logic states of both a scan enable signal applied to the scan enable input and a diagnostic enable signal applied to the diagnostic enable input.

3. The integrated circuit of claim 1 wherein the scan chain of the first type comprises a vertical scan chain and the scan chain of the second type comprises a horizontal scan chain.

4. The integrated circuit of claim 1 wherein the scan test circuitry further comprises:

a decompressor; and a compressor;

wherein the scan chain of the first type is one of a plurality of vertical scan chains arranged in parallel with one another between respective outputs of the decompressor and respective inputs of the compressor;

wherein scan test input data from the decompressor is shifted into the vertical scan chains and scan test output data is shifted out of the vertical scan chains into the compressor; and wherein the scan chain of the second type is one of a plurality of horizontal scan chains with each such horizontal scan chain being formed by a plurality of scan cells including one scan cell from each of a corresponding subset of the plurality of vertical scan chains.

5. The integrated circuit of claim 4 wherein the plurality of horizontal scan chains comprises one horizontal scan chain for each of the outputs of the compressor.

6. The integrated circuit of claim 4 wherein the scan test circuitry further comprises multiplexing circuitry configured to select between outputs of the compressor and corresponding outputs of respective ones of the plurality of horizontal scan chains responsive to a diagnostic enable signal.

7. The integrated circuit of claim 6 wherein in the first scan shift mode of operation the multiplexing circuitry selects the outputs of the compressor for delivery to a tester and in the second scan shift mode of operation the multiplexing circuitry selects the outputs of the horizontal scan chains for delivery to the tester.

8. The integrated circuit of claim 6 wherein the multiplexing circuitry comprises a plurality of two-to-one multiplexers, with each such two-to-one multiplexer having a first input coupled to a corresponding output of the compressor, a second input coupled to a corresponding output of one of the horizontal scan chains, and a select line driven by the diagnostic enable signal.

9. The integrated circuit of claim 6 wherein each of the scan cells of each of the horizontal scan chains comprises a diagnostic enable input adapted to receive the diagnostic enable signal for use in combination with a scan enable signal applied to a scan enable input of the scan cell in configuring the scan cell in accordance with one of the first and second scan shift modes of operation.

10. The integrated circuit of claim 2 wherein the given scan cell further comprises:

a first multiplexer having first and second inputs coupled to the respective first and second scan inputs of the scan cell;

a second multiplexer having a first input coupled to an output of the first multiplexer and a second input coupled to the data input of the scan cell; and a flip-flop having a data input coupled to an output of the second multiplexer and a data output coupled to the data output of the scan cell;

wherein select lines of the first and second multiplexers are coupled to the diagnostic enable input and the scan enable input, respectively.

11. The integrated circuit of claim 2 wherein the given scan cell further comprises:

a multiplexer having first and second inputs coupled to the respective first and second scan inputs of the scan cell and a third input coupled to the data input of the scan cell; and a flip-flop having a data input coupled to an output of the multiplexer and a data output coupled to the data output of the scan cell;

wherein first and second select lines of the multiplexer are coupled to the scan enable input and the diagnostic enable input, respectively.

12. A disk drive controller comprising the integrated circuit of claim 1.

13. A method comprising:

operating scan test circuitry of an integrated circuit in a first scan shift mode of operation in which a given scan cell having at least first and second scan inputs is configured with a first set of one or more other scan cells into a scan chain of a first type using the first scan input; and operating the scan test circuitry of the integrated circuit in a second scan shift mode of operation in which the given scan cell is configured with a second set of one or more other scan cells different than the first set of one or more other scan cells into a scan chain of a second type using the second scan input.

14. The method of claim 13 further comprising selecting a particular one of the first and second scan shift modes responsive to logic states of both a scan enable signal applied to a scan enable input of the given scan cell and a diagnostic enable signal applied to a diagnostic enable input of the given scan cell.

15. The method of claim 13 wherein the step of operating the scan shift circuitry in the first scan shift mode of operation further comprises forming the scan chain of the first type as one of a plurality of vertical scan chains arranged in parallel with one another between respective outputs of a decompressor of the scan test circuitry and respective inputs of a compressor of the scan test circuitry, such that scan test input data from the decompressor is shifted into the vertical scan chains and scan test output data is shifted out of the vertical scan chains into the compressor, and further wherein the step of operating the scan test circuitry in the second mode of operation comprises forming the scan chain of the second type as one of a plurality of horizontal scan chains with each such horizontal scan chain being formed by a plurality of scan cells including one scan cell from each of a corresponding subset of the plurality of vertical scan chains, such that the plurality of horizontal scan chains comprises one horizontal scan chain for each of the outputs of the compressor.

16. The method of claim 15 wherein the operating steps further comprise in the first scan shift mode of operation selecting the outputs of the compressor for delivery to a tester and in the second scan shift mode of operation selecting the outputs of the horizontal scan chains for delivery to the tester.

17. A computer program product comprising a non-transitory computer-readable storage medium having computer program code embodied therein for use in scan testing an integrated circuit, wherein the computer program code when executed in a testing system causes the testing system to perform the steps of the method of claim 13.

18. A processing system comprising:
a processor; and
a memory coupled to the processor and configured to store information characterizing an integrated circuit design;
wherein the processing system is configured to provide within the integrated circuit design scan test circuitry comprising scan cells configurable to form scan chains and supporting first and second scan shift modes of operation;
at least a given one of the scan cells having at least first and second scan inputs;
wherein in the first scan shift mode of operation the given scan cell is configured with a first set of one or more other scan cells into a scan chain of a first type using the first scan input; and
wherein in the second scan shift mode of operation the given scan cell is configured with a second set of one or more other scan cells different than the first set of one or more other scan cells into a scan chain of a second type using the second scan input.

19. An apparatus for use in scan testing an integrated circuit, the apparatus comprising:
a scan cell comprising at least first and second scan inputs;
wherein in a first scan shift mode of operation the scan cell is configured with a first set of one or more other scan cells into a scan chain of a first type using the first scan input; and
wherein in a second scan shift mode of operation the scan cell is configured with a second set of one or more other scan cells different than the first set of one or more other scan cells into a scan chain of a second type using the second scan input.

20. The apparatus of claim 19 wherein the given scan cell further comprises:
a data input;
a data output;
a scan enable input; and
a diagnostic enable input;
wherein a particular one of the first and second scan shift modes is selected responsive to logic states of both a scan enable signal applied to the scan enable input and a diagnostic enable signal applied to the diagnostic enable input.

* * * * *